United States Patent
Desu et al.

[11] Patent Number: 6,139,780
[45] Date of Patent: Oct. 31, 2000

[54] DYNAMIC RANDOM ACCESS MEMORIES WITH DIELECTRIC COMPOSITIONS STABLE TO REDUCTION

[75] Inventors: Seshu B. Desu; Carlos A. Suchicital, both of Blacksburg, Va.; Dilip P. Vijay, Foster City, Calif.

[73] Assignee: Sharp Kabushiki Kaisha, Osaka, Japan

[21] Appl. No.: 09/086,405

[22] Filed: May 28, 1998

[51] Int. Cl.[7] .............................. G02B 5/20; C01G 23/00; C04B 35/46; H01G 4/06
[52] U.S. Cl. .................... 252/584; 423/598; 501/139; 361/321.5
[58] Field of Search ..................... 252/584; 423/598; 501/139; 361/321.5

[56] References Cited

U.S. PATENT DOCUMENTS

| | | | |
|---|---|---|---|
| 4,484,251 | 11/1984 | Masujima et al. | 361/321.5 |
| 4,781,859 | 11/1988 | Noi | 501/139 |
| 4,900,323 | 2/1990 | Narumi et al. | 423/598 |
| 4,938,892 | 7/1990 | Toyoda et al. | 423/598 |
| 5,314,651 | 5/1994 | Kulwicki | 423/598 |
| 5,445,806 | 8/1995 | Kinugaska et al. | 423/598 |
| 5,453,908 | 9/1995 | Tsu et al. | 423/598 |
| 5,614,018 | 3/1997 | Azuma et al. | 423/598 |
| 5,614,252 | 3/1997 | McMillan et al. | 423/598 |
| 5,624,707 | 4/1997 | Azuma et al. | 252/584 |

OTHER PUBLICATIONS

Fu et al., Journal of Materials Science, vol. 25, pp. 4042–4046, (1990).

*Primary Examiner*—Philip Tucker
*Attorney, Agent, or Firm*—Gibson, Dunn & Crutcher LLP

[57] ABSTRACT

A charge storage device is resistant to degradation in reducing atmospheres for use in dynamic random access memories. The device consists of a dielectric layer that is sandwiched between two electrodes and grown on a suitable substrate such as silicon or silicon coated with silicon dioxide. The dielectric layer is either (a) a modified composition of $Ba_xSr_{1-x}TiO_3$, $0<x<1$ (BST) doped with acceptor type dopants such as Mn, Co, Mg, Cr, Ga and Fe ions as the dielectric layer in the capacitor; the acceptor ions can occupy the titanium sites to prevent the formation of $Ti^{3+}$ and inhibit the formation of conductive BST by compensating the charges of the oxygen vacancies, and by trapping the free electrons more freely than $Ti^{4+}$, or (b) modified dielectric compositions with alkaline-earth ions with compositions $[(Ba_xM_x)O]_yTiO_2$ (where M can be Ca, Sr or Mg) with the value of y slightly larger than unity.

2 Claims, 1 Drawing Sheet

| |
|---|
| 1 4 |
| 1 3 |
| 1 2 |
| 1 1 |
| 1 0 |

DYNAMIC RANDOM ACCESS MEMORIES WITH DIELECTRIC COMPOSITIONS STABLE TO REDUCTION

BACKGROUND OF THE INVENTION

1. Field of the Invention

This invention relates to memory devices, and more particularly to a memory device such as a dynamic random access memory (DRAM) that has dielectric compositions stable or resistant to $H_2$ and other anneal treatments and is stable to a reducing atmosphere.

2. Description of Related Art

Since its introduction more than three decades ago, the dynamic random access memory has been successfully adopted as a device to store information in the form of charge [see L. H. Parker and A. F. Tasch, IEEE Devices and Circuit Magazine, January 1990, p. 17]. One of the more popular configurations for the memory cells in these devices involves a single capacitor in which charge is stored, and a single transistor that is used to isolate the capacitor. Over the years, as the number of memory cells has been increased from 4 kilobits (kb) in the original designs to Megabit (Mb) levels in the current designs, there has been a constant reduction in the available area per memory cell to maintain acceptable die sizes. This reduction in area has made it necessary to increase the charge density on the capacitor to maintain adequate signal margins. Some of the ways through which this increased charge storage density has been achieved is through improvements in process technology, reduction in dielectric thickness and innovative cell geometries. For cell densities up to 64 Mb, the preferred dielectric material and capacitor geometry has been a $SiO_2$-$Si_3N_4$ sandwich layer. For future generation memories, DRAM memory units must have an increasingly high capacitance per unit area [C/A, with leakage currents on the order of $10^{-7}$ A. The following equation relates the capacitance per unit area to the appropriate material parameters:

$$[C/A] = [Er/d]$$

where Er is the relative dielectric constant, and d is the capacitor's dielectric film thickness. In the past, with $SiO_2$ as the dielectric material, the capacitance per unit area was boosted in each successive generation by simply reducing its film thickness (d) or by using innovative geometries to increase the effective area of the capacitor on a given substrate. However, $SiO_2$ is quickly approaching its capacitance per unit area limit, as further decreases in the thickness will eventually lead to an unacceptably high leakage current and increasing processing difficulties. Therefore, for higher density memories (e.g., 256 Mb and above) to be used with the same charge-storage concept, it becomes necessary to find alternate dielectric materials that can store a greater charge density. In other words, alternate dielectric materials with higher dielectric constants (compared to $SiO_2Si_3N_4$) need to be used. In addition, these materials must also be compatible with VLSI (very large scale integration, used herein to encompass U(ltra) LSI and the like) processing.

One of the primary candidates for capacitor dielectrics in future generation DRAMs is barium strontium titanate ($Ba_xSr_{1-x}TiO_3$, $0<x<1$) (BST). This compound is essentially a solid solution of $BaTiO_3$ and $SrTiO_3$ and crystallizes in the perovskite type structure with a chemical formula $ABO_3$. The dielectric constant exhibited by these materials can vary between 200–600 at room temperature and zero bias depending on the composition [Ba/Sr ratio], frequency of measurement and thickness of the material. The thin film processibility of these materials has been demonstrated in our own laboratory and in several other recent works wherein high quality stoichiometric compositions of these materials have been produced by metalorganic decomposition, metalorganic chemical vapor deposition, sputtering, laser ablation, etc. [see K. V. Belanov, E. A. Goloborod'ko, O. E. Zavadovski, Yu. A. Kontsevoi, V. M. Mukhorotv and Yu. S. Tikhodeev, Sov. Phys. Tech. Phys., 29, 1037, 1984; D. Roy and S. B. Krupanidhi, Appl. Phys. Lett., 62, 1056, 1993; W. A. Feil, B. W. Wessels, L. M. Tonge and T. J. Marks, J. Appl. Phys., 67,3858, 1990; B. W. Wessels, L. A. Willis, H. A. Lu, S. R. Gilbert, D. A. Neumayer and T. J. Marks, in CVDXII, edited by K. Jensen, Electrochemical Society, N.J., 1993]. The qualification of these capacitors is typically done by measuring their current-voltage (leakage current) characteristics and their dielectric behavior (dielectric constant and dielectric loss) in the desired frequency and temperature ranges.

However, one of the primary reliability problems that may preclude the use of these materials as capacitor dielectrics for DRAM applications is their poor resistance to reducing environments (e.g., $H_2$ anneal treatments). Because of their high melting points and their strong tendency towards reduction in low oxygen partial pressures, compositions that are based on alkaline-earth titanates require both high temperatures and oxidative environments for their processing. These titanates, when heat treated in reducing atmosphere, become highly conductive due to the conversion of $Ti^{4+}$ ions into $Ti^{3+}$ ions accompanying the formation of oxygen vacancies. In terms of VLSI fabrication this is a major disadvantage because of the several post processing steps (after the capacitor fabrication) involving the use of reducing atmospheres. Some of these steps include (a) the deposition of $SiO_2$ or $Si_3N_4$, for passivation or encapsulation using $SiH_4$ precursors during which $H_2$ is released as the product gas and (b) forming gas (90% $N_2$+10% $H_2$) treatments after the aluminum metallization depositions for oxide removal. For BST based DRAMs to be a viable memory product, it is necessary to identify a processing scheme that is capable of inhibiting the reduction of these alkaline-earth titanates.

In this disclosure we describe a thin film device and the associated processing scheme, for use as a dielectric capacitor in a DRAM cell. This device meets all the standard device quality requirements (I/V characteristics, dielectric constant, dielectric loss, etc.) and is also capable of withstanding drastically reducing atmospheres.

SUMMARY OF THE INVENTION

It is the general object of this invention to provide a thin film capacitor device for memory applications. It is a more specific object of this invention to provide a high dielectric constant capacitor that can be used to store information in a dynamic random access memory (DRAM). It is also a more specific object of this invention to provide a high dielectric constant capacitor for a DRAM device that is resistant to reduction and therefore degradation in reducing environments.

According to one embodiment of the present invention, these and other objects are obtained by using $Ba_xSr_{1-x}TiO_3$, $0<x<1$, (BST) doped with acceptor type dopants such as Mn, Co, Mg, Cr, Ga and Fe ions as the dielectric layer in the capacitor. The acceptor ions can occupy the titanium sites to prevent the formation of $Ti^{3+}$ and inhibit the formation of conductive BST by compensating the charges of the oxygen vacancies and by trapping the free electrons more freely than $Ti^{4+}$. According to another embodiment of the present invention, these and other objects are obtained by using modified dielectric compositions with alkaline-earth ions with compositions $[(Ba_{1-x}M_x)O]_yTiO_2$ (where M can be Ca, Sr or Mg) with the value of y slightly larger than unity.

According to an embodiment, the invention is a thin film device that is resistant to reduction under $H_2$ annealing at high temperatures having a substrate; a metallic bottom electrode layer laid on top of the substrate; an adhesion or diffusion barrier layer between the bottom electrode and the substrate; a dielectric layer on top of the electrode that is resistant to $H_2$ reduction; and a top electrode layer on top of the dielectric layer.

The substrate may be a material selected from the group consisting of silicon, silicon dioxide, silicon with silicon oxide coating, and gallium arsenide.

The metallic bottom electrode layer is selected from the group consisting of transition metals such as Rh, Ru, Ir, Re, Os or metals such as Pt, Pd, Ag, Au, etc. Or, the bottom electrode layer may be selected from the group consisting of oxides of transition metals such as $Rh_2O_3$, $RuO_2$, IrOo, $ReO2$, $O_5O_2$, etc., oxides of other metals such as Pt, Pd, etc., perovskite oxides such as La-Sr-Co-O, doped $SrTiO_3$, Y-Ba-CuO etc. Or, the bottom electrode layer may be a multilayer of a metal selected from a group consisting of transition metals such as Rh, Ru, Ir, Re, Os or metals such as Pt, Pd, Ag, Au, etc.; and a metal oxide of transition metals such as $Rh_2O_3$, $RuO_2$, $IrO_2$, $ReO_2$, $OsO_2$, etc., oxides of other metals such as Pt, Pd etc., perovskite oxides such as La-Sr-Co-O, doped SrTiO3, Y-Ba-Cu-O, etc.

The adhesion interlayer may be a metal such as Ti, Ni, Ta etc. or an oxide such as $ZrO_2$, $TiO_2$, $Ta_2Os$ or a nitride such as Zr-N, Ti-N, Ta-N, etc.

The diffusion barrier may be a oxide such as $Rh_2O_3$, $RuO_2$, $IrO_2$, $ReO_2$, $OsO_2$, $ZrO_2$, $TiO_2$, $Ta_2Os$, etc., or a nitride such as TiN, $Si_3N_4$, etc., or a silicide such as $TiSi_2$, $TaSi_2$, etc.

The dielectric layer resistant to $H_2$ reduction may be a modified composition of $Ba_xSr_{1-x}TiO_3$, $0<x<1$, (BST) doped with acceptor type dopants such as Mn, Co, Mg, Cr. Ga and Fe ions.

The dielectric layer that is resistant to $H_2$ reduction may be ABO3, where A=Ba, Sr etc., B=Ti etc. and stoichiometry of A/B is greater than one.

The dielectric layer may be an alkaline-earth titanate with composition $[(Ba_{1-x}M_x)O]_yTiO_2$ (where M comprises Ca, Sr or Mg) with the value of y slightly larger than unity.

The dielectric layer may be one of the following perovskite titanate compositions including $(A_xA'_{1.01-x})(B_yB'_{1-y})O_3$, where A is Ba, A' comprises Sr, Ca or Mg, B is Ti, B' is Zr, $0<x<1$, $0<y<1$; and the stoichiometry of A' over B' is greater than 1.01.

The dielectric layer may be $(Ba_{0.50}Sr_{0.51})(Ti_{0.98}Zr_{0.02})O_3$, $(Ba_{0.40}Sr_{0.61})(Ti_{0.98}Zr_{0.02})O_3$, $(Ba_{0.60}Sr_{0.41})(Ti_{0.98}Zr_{0.02})O_3$, or $(Ba_{0.50}Sr_{0.51})(Ti_{0.98}Zr_{0.02})O_3$ doped with 1–10 atom % Ho or Nb.

The top electrode layer metal layer may be selected from a group consisting of transition metals such as Rh, Ru, Ir, Re, Os, or metals such as Pt, Pd, Ag, Au, etc.

The top electrode may be selected from a group consisting of oxides of transition metals such as $Rh_2O_3$, $RuO_2$, $IrO_2$, $ReO_2$, $OsO_2$, etc., oxides of other metals such as Pt, Pd, etc., perovskite oxides such as La-Sr-Co-O, doped $SrTiO_3$, Y-BaCu-O, etc.

The top electrode may be a multilayer of a metal selected from a group consisting of transition metals such as Rh, Ru, Ir, Re, Os or metals such as Pt, Pd, Ag, Au, etc. and a metal oxide of transition metals such as $Rh_2O_3$, $RuO_2$, $IrO_2$, $ReO_2$, $OsO_2$, etc., oxides of other metals such as Pt, Pd, etc., perovskite oxides such as La-Sr-Co-O, doped $SrTiO_3$, Y-Ba-Cu-O, etc.

The interlayer and the top and bottom electrode layers may be deposited by any of the thin film physical vapor deposition processes including sputtering, evaporation, laser ablation, molecular beam epitaxy, etc. or any variations of these processes.

The interlayer and said top and bottom electrode layers may be deposited by any of the thin film chemical deposition processes such as sol-gel method, metalorganic deposition, metalorganic chemical vapor deposition or combinations and variations thereof.

In some embodiments, the dielectric layer is deposited by any of the thin film physical vapor deposition process such as sputtering, evaporation, laser ablation, molecular beam epitaxy, etc. or any variations of these processes thereof. In some embodiments, the dielectric layer is deposited by any of the thin film chemical deposition processes such as sol-gel method, metalorganic deposition, metalorganic chemical vapor deposition or combinations and variations thereof.

The device may further include a dynamic random access memory incorporating said device. The device may further include a large scale integrated circuit

BRIEF DESCRIPTION OF THE DRAWING

The FIGURE is a schematic of a capacitor device according to an embodiment of the present invention.

DESCRIPTION OF SPECIFIC EMBODIMENTS

Referring to the FIGURE, a dielectric capacitor device is shown according to one embodiment of the invention. A substrate (10) has the bottom electrode (12) deposited on it to act as a conductor for making connection to other circuit elements in the integrated circuit. The substrate (10) in most cases is a layer of silicon dioxide over a silicon chip. Of course, the substrate may also be bare silicon, gallium arsenide or a multilayer structure having various circuit elements in a silicon chip having layers of silicon dioxide, polysilicon, implanted silicon layers etc. to form what is referred to as a complex integrated circuit. A layer (11) is formed between the substrate (10) and the bottom electrode structure (12) for adhesion and/or diffusion barrier purposes. Thus it provides the necessary adhesion for the metal to the underlying substrate material. The electrode layer (12) is usually a metal such as Rh, Ir, Ru, Os, Pt, Re etc. (transition metals) or an alloy of one or more of these metals such as Pt-Rh, Pt-Ir, Rh-Ir etc., or conducting oxides such as $Rh_2O_3$, $IrO_2$, $RuO_2$, etc. The layer (12) may be deposited by any one of the known physical or chemical process for deposition of thin films such as sputtering, evaporation, laser ablation, sol-gel, metalorganic deposition, chemical vapor deposition or any other variations of these processes.

The dielectric material (13) is deposited on top of the bottom electrode (12) by any viable thin film deposition technique which can provide good uniformity and stoichiometry in the film. The dielectric material is a modified composition of $BaxSr_{1-x}TiO_3$, $0<x<1$, (BST) doped with acceptor type dopants such as Mn, Co, Mg, Cr, Ga and Fe ions. The dielectric materials can also be modified dielectric compositions with alkaline-earth ions with compositions $[(Ba_{1-x}M_x)O]_yTiO_2$ (where M can be Ca, Sr or Mg) with the value of y slightly larger than unity. A more specific example is one of the following perovskite titanate compositions including $(A_xA'_{1.01-x})(B_yB'_{1-y})O_3$, where A is Ba, A' is Sr, Ca or Mg; B is Ti; B' is Zr; $0<x<1$ and $0<y<1$. Note that the stoichiometric ratio of A over B is greater than 1.0, and the above stated composition with 0–10% $Ho_2O_3$ or $Nb_2O_5$ added as dopants. These materials may be deposited by any one of the known physical or chemical processes for deposition of thin films such as sputtering, evaporation, laser ablation, sol-gel method, metalorganic deposition, chemical vapor deposition or any other variations of these processes. The top electrode (14) can either be composed of material which is the same as bottom electrode (12) or of a different metal oxide/metal multilayer. For example, layer (14) could be Rh, Ir, Ru, Os, Pt, Re, etc. or an oxide of alloys of one or more of these metals. Layer (14), once again, may be deposited by any one of the known physical or chemical process for deposition of thin films such as sputtering, evaporation, laser ablation, sol-gel methods, metalorganic deposition, chemical vapor deposition or any other variations of these processes.

An example embodiment of the invention, using $(Ba_{0.4}Sr_{0.61})(Ti_{0.98}Zr_{0.02})O_3$ as the dielectric material, Si(100) coated with 100 nm $SiO_2$ as the substrate, Pt as the electrode (top and bottom) material and Ti as the adhesion layer was used as a test vehicle. The adhesion layer and the Pt bottom electrode were deposited in-situ by the sputtering process. The sputtering process was conducted in an RF sputtering chamber at a substrate temperature of 300° C. using the corresponding metal targets. The total gas pressure was maintained at 5 mTorr while the RF power was kept at 50 W. The thickness of electrode layer was 300 nm while the interlayer was deposited to a thickness of 30 nm. The $SiO_2$ oxide layer was grown on top of the p-type Si(100) substrate to a thickness of 100 nm by thermal oxidation at a temperature of 950° C. in wet $O_2$. The deposition of the dielectric film on top of these platinized substrates was done by laser ablation. Recently, there has been considerable interest in the technique of pulsed laser ablation for the deposition of multicomponent dielectric thin films. This technique has become particularly attractive ever since it was used to successfully deposit in-situ multicomponent high temperature superconducting oxide thin films. It offers the advantages of multicomponent composition and phase control of complex oxides, in-situ epitaxial growth of thin films, compatibility with semiconductor technology and ability to deposit a wide variety of materials over a broad pressure regime.

A "Lambda Physik LPX 300" excimer laser utilizing KrF radiation (248 nm) was focused onto a rotating target of the starting material $((Ba_{0.4}Sr_{0.61})(Ti_{0.98}Zr_{0.02})O_3)$ with a 50 cm UV graded plano-convex lens. The energy of the incoming beam was 600 mJ/pulse and the laser was operated at a frequency of 10 Hz. The beam was incident on the target at an angle of 45°; the target was rotated at a speed of 10–13 rpm. The targets were processed by mixing $BaCO_3$, $SrCO_3$, $TiO_2$ and $ZrO_2$ powders in stoichiometric ratios by ball milling, followed by calcination of the mixed powders at 1000° C., pressing of the calcined powders at 10000 psi in a circular die and sintering of the pressed pellets at 1100° C. for 1 hr in a furnace at ambient conditions. Substrates of $Si/SiO_2/Ti/Pt$ were mounted onto a heated stainless steel block using thermally activated silver paint and placed parallel to the target at a distance of 4–5 cm. The substrate holder was also rotated to ensure uniform deposition across the wafer surface. The depositions were carried out under an oxygen ambient of 200 mTorr and a substrate temperature of 700° C. The dielectric films were deposited to a thickness of 300 nm. Top electrodes of Pt (300 nm) were then sputter deposited onto the samples through a shadow mask by RF sputtering to complete the device structure. The sputtering process was conducted once again in an RF sputtering chamber at room temperature using Pt (2 inches in diameter 0.125 inches in thickness) as the target. The total gas pressure (Ar) was maintained at 5 mTorr while the RF power was kept at 50 W. The sputtering process for the top electrodes was done through a contact shadow mask made of stainless steel that contained a circular hole $2.1\times10-4$ $cm^2$ in area.

X-ray diffraction studies on the deposited samples showed single phase modified barium strontium titanate at this deposition temperature. In fact, in other embodiments of this invention, wherein the films were deposited in the temperature ranges between 400–700° C., it was found that the crystalline phase formation was observed at temperatures as low as 500° C. as indicated by a 2θ peak at 32°. Surface (using x-ray photoelectron spectroscopy) and bulk composition (using wavelength dispersive x-ray analysis) studies indicate that the composition of the films are very close to the desired composition meaning that all the elements of the ablation target were included in the desired stoichiometric proportions in the deposited films. The dielectric constant of the as-deposited samples were measured as a function of frequency using a "HP4192A" impedance analyzer. The films deposited to a thickness of 300 nm at 700° C. exhibited a dielectric constant of 400 in the frequency range between 10 kHz and 1 MHZ and at zero bias which is the typical operating frequency range in the actual device. The as-deposited test capacitors were then tested for their leakage current characteristics using a "Keithley 610" electrometer. Voltages in increments of 1 V were applied to capacitors and the corresponding current response was measured. After the measurements on the as-deposited samples, annealing was performed in a quartz tube furnace at a temperature of 500° C. for 3 hours in an extreme atmosphere of flowing $H_2$. The annealed samples were then tested once again for their dielectric behavior and current-voltage characteristics. Comparison of the results indicates that up to 5 V, there is very little difference in the current values between the as-deposited and annealed samples. Furthermore, these leakage current values and the dielectric constants are well within the range of values required for actual device operation in the DRAM. The results of the measurements clearly indicate that the process of the present invention is successful in overcoming the existing $H_2$ reduction problems with barium strontium titanate capacitors.

While the invention has been described with reference to a specific embodiment, the description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments which fall within the true scope of the invention.

What is claimed is:

1. A dielectric comprising $Ba_xSr_{1-x}TiO_3$, $0<x<1$, (BST) doped with an acceptor type dopants, which are selected from the group consisting of Co, Ga and Fe ions and combinations of the same.

2. A dielectric composition stable to reduction comprising a composition selected from the group consisting of $(Ba_{0.50}Sr_{0.51})(Ti_{0.98}Zr_{0.02})O_3$, $BaO_{0.40}Sr_{0.61})(Ti_{0.98}Zr_{0.02})O_3$, $(Ba_{0.60}Sr_{0.41})(Ti_{0.98}Zr_{0.02})O_3$, and $(Ba_{0.50}Sr_{0.51})(Ti_{0.98}Zr_{0.02})O_3$; wherein the composition is doped with 1–10 atom % Ho.

* * * * *